US009127353B2

(12) United States Patent
Matsumoto et al.

(10) Patent No.: US 9,127,353 B2
(45) Date of Patent: Sep. 8, 2015

(54) FILM-FORMING APPARATUS AND FILM-FORMING METHOD

(75) Inventors: Seiken Matsumoto, Utsunomiya (JP); Seiji Kuwabara, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 579 days.

(21) Appl. No.: 13/359,802

(22) Filed: Jan. 27, 2012

(65) Prior Publication Data

US 2012/0199471 A1  Aug. 9, 2012

(30) Foreign Application Priority Data

Feb. 3, 2011  (JP) .................................. 2011-021465
Jan. 25, 2012  (JP) .................................. 2012-013169

(51) Int. Cl.
  *C23C 14/34*  (2006.01)
  *C23C 14/35*  (2006.01)
  *H01J 37/34*  (2006.01)

(52) U.S. Cl.
  CPC ......... *C23C 14/3407* (2013.01); *C23C 14/3428* (2013.01); *C23C 14/3464* (2013.01); *C23C 14/352* (2013.01); *H01J 37/3417* (2013.01); *H01J 37/3429* (2013.01); *H01J 37/3447* (2013.01)

(58) Field of Classification Search
  CPC ............ C23C 14/3407; C23C 14/3428; C23C 14/3464; C23C 14/352; H01J 37/3447; H01J 37/3417; H01J 37/3429
  USPC .............. 204/298.11, 298.23, 298.26, 192.12
  See application file for complete search history.

(56) References Cited

U.S. PATENT DOCUMENTS

| 3,537,973 | A | * | 11/1970 | Herte et al. | ............... 204/298.26 |
| 5,134,092 | A |   | 7/1992  | Matsumoto et al. | |
| 5,489,446 | A |   | 2/1996  | Matsumoto | |
| 6,051,113 | A | * | 4/2000  | Moslehi | ................... 204/192.12 |

(Continued)

FOREIGN PATENT DOCUMENTS

| CN | 101778961 A | 7/2010 |
| JP | 7331432 A | 12/1995 |

(Continued)

OTHER PUBLICATIONS

Office Action in CN Application No. 201210023612.3 issued Jan. 20, 2014, with English translation (12 pgs.).

(Continued)

*Primary Examiner* — Rodney McDonald
(74) *Attorney, Agent, or Firm* — Fitzpatrick, Cella, Harper & Scinto

(57) ABSTRACT

Provided are a film-forming apparatus and a film-forming method capable of preventing complication of an apparatus mechanism in formation of a thin film of multiple materials by sputtering to simplify the apparatus mechanism and preventing an increase in an apparatus cost. The film-forming apparatus includes a vacuum chamber, a substrate holder for holding a substrate, cathode mechanisms for supporting targets respectively so that the targets can be opposed to the substrate in the vacuum chamber, and shutters movable forward and backward individually between the targets made of different materials and the substrate to block or pass film-forming particles generated from the targets. At least one of the shutters is formed of a target material different from those for the targets so that the at least one of the shutters is configured as a shutter that also functions as a target.

14 Claims, 15 Drawing Sheets

(56) References Cited

U.S. PATENT DOCUMENTS

| | | |
|---|---|---|
| 8,133,364 B2 | 3/2012 | Engle |
| 2009/0120501 A1 | 5/2009 | Engle |
| 2010/0243438 A1 | 9/2010 | Yamaguchi et al. |

FOREIGN PATENT DOCUMENTS

| | | |
|---|---|---|
| JP | 2003-113467 A | 4/2003 |
| JP | 2010-106290 A | 5/2010 |

OTHER PUBLICATIONS

European Search Report in EP Application No. 12000675.4, dated Apr. 25, 2012, 6 pages.

Chinese office action issued in corresponding 201210023612.3 dated Sep. 3, 2014—15 pages.

* cited by examiner

FILM-FORMING APPARATUS AND FILM-FORMING METHOD

BACKGROUND OF THE INVENTION

1. Field of the Invention

The present invention relates to a film-forming apparatus and a film-forming method for forming a thin film by sputtering.

2. Description of the Related Art

In general, in a process of manufacturing a semiconductor device, a display device, an illumination device, an imaging device, and other electronic and optical components, a thin-film forming technology is indispensable. As a method of forming a thin film, a sputtering method is well known. The thin-film forming technology using sputtering has such advantages that a thin film can be formed at low temperature, that a thin film having a large area can be formed, and that electric control of film-forming parameters is performed easily.

The sputtering method is performed by a sputtering apparatus. According to such a sputtering method, accelerated ions are irradiated to a target so that target particles are ejected from the target, and the target particles are deposited on a silicon wafer or a glass substrate in a thin film shape.

The thin-film forming technology using sputtering has a number of superior aspects in terms of performance compared with an evaporation method or chemical vapor deposition (CVD), but an apparatus mechanism may become complicated. For example, a conventional sputtering apparatus 71 provided with multiple (for example, three) targets is described with reference to FIG. 9 as a schematic view.

As illustrated in FIG. 9, the conventional sputtering apparatus 71 has a vacuum chamber 72. A substrate holder 32 that functions as an anode with one end thereof grounded is placed in an upper part of the vacuum chamber 72, and a substrate 31 is removably held by the substrate holder 32. A film to be formed on a lens used as the substrate 31 is an antireflection film of a general optical component, which is a multilayered film made of, for example, $Ta_2O_5$, $SiO_2$, and $Al_2O_3$.

Cathode mechanisms 21, 22, and 23 are placed in a center part of the vacuum chamber 72, and a DC high-voltage power supply (hereinafter, referred to as "DC power supply") 51 capable of applying a high voltage through power supply switches 3, 4, and 10 is connected to the cathode mechanisms 21, 22, and 23. A negative electrode of the DC power supply 51 is connected to the power supply switches 3, 4, and 10 side, and a positive electrode of the DC power supply 51 is grounded. The cathode mechanisms 21, 22, and 23 are placed in parallel, and targets 11, 12, and 13 are removably mounted to upper portions of the cathode mechanisms 21, 22, and 23, respectively. The target 11 is formed of Ta, the target 12 is formed of Si, and the target 13 is formed of Al.

In an upper part of the vacuum chamber 72, shutters 41, 44, and 43 made of SUS stainless steel are placed separately between the targets 11, 12, and 13 and the substrate 31. The shutter 41 is connected to a driving device 5 placed outside the vacuum chamber 72 and configured so as to move forward and backward with a predetermined space ensured above the target 11. The shutter 44 is connected to a driving device 6 placed outside the vacuum chamber 72 and configured so as to move forward and backward with a predetermined space ensured above the target 12. The shutter 43 is connected to a driving device 9 placed outside the vacuum chamber 72 and configured so as to move forward and backward with a predetermined space ensured above the target 13. As illustrated in FIG. 9, plasma 721 is generated on the target 12.

In the conventional sputtering apparatus 71, the cathode mechanisms 21, 22, and 23 are required separately for the Ta target 11, the Si target 12, and the Al target 13, which renders the mechanism complicated and also increases the apparatus cost (see Japanese Patent Application Laid-Open Nos. H07-331432 and 2003-113467).

By the way, even regarding optical components to be used in the same imaging device, an increase in an apparatus cost is acceptable in an industrial product such as a semiconductor exposure device in which performance is prioritized compared with a cost, whereas a cost is most prioritized in the case where an optical component is used in a camera or broadcasting equipment for general consumers. Further, in thin-film formation in an optical component, it is necessary to use an apparatus capable of sputtering multiple (at least two kinds of) materials, for example, in the case of manufacturing an antireflection film.

However, in order to sputter multiple materials, targets and mechanisms on the periphery of cathodes accompanying the targets need to be placed in the sputtering apparatus in accordance with the number of the materials. As a result, the apparatus cost increases in accordance with the number of the mechanisms, and further, the apparatus is enlarged in accordance with the volumes of the mechanisms, which may increase the apparatus cost.

SUMMARY OF THE INVENTION

It is therefore an object of the present invention to provide a film-forming apparatus and a film-forming method capable of preventing complication of an apparatus mechanism in formation of a thin film of multiple materials by sputtering or the like to simplify the apparatus mechanism and preventing an increase in an apparatus cost.

The present invention provides a film-forming apparatus for forming a thin film on a film formation subject by sputtering, including: a vacuum chamber; a holder portion for holding the film formation subject in the vacuum chamber; multiple cathode mechanisms for respectively supporting targets so that the targets are opposed to the film formation subject in the vacuum chamber; and multiple shutters movable forward and backward individually between a plurality of the targets made of materials different from each other and the film formation subject to one of block and pass film-forming particles generated from the targets, in which at least one of the multiple shutters is formed of a target material different from the materials for the plurality of the targets so that the at least one of the multiple shutters is configured as a shutter that also functions as a target.

According to the present invention, the shutter originally accompanying the film-forming apparatus using sputtering or the like is also used as a target, and hence there is no risk that a complicated cathode mechanism is prepared separately to enlarge the apparatus. This can prevent the complication of the apparatus mechanism to simplify the apparatus mechanism and prevent the increase in the apparatus cost.

Further features of the present invention will become apparent from the following description of exemplary embodiments with reference to the attached drawings.

DESCRIPTION OF THE EMBODIMENTS

Hereinafter, embodiments of the present invention are described with reference to the drawings. First, referring to FIG. 1, the overall configuration and functions of a sputtering apparatus 1 capable of performing a sputtering method (film-forming method) according to the present invention are described. All control systems of the sputtering apparatus 1 serving as a film-forming apparatus are connected to a computer (not shown) serving as a control portion so that the computer can collectively control the control systems. A program for performing the sputtering method is installed to the control portion.

Figure 1:
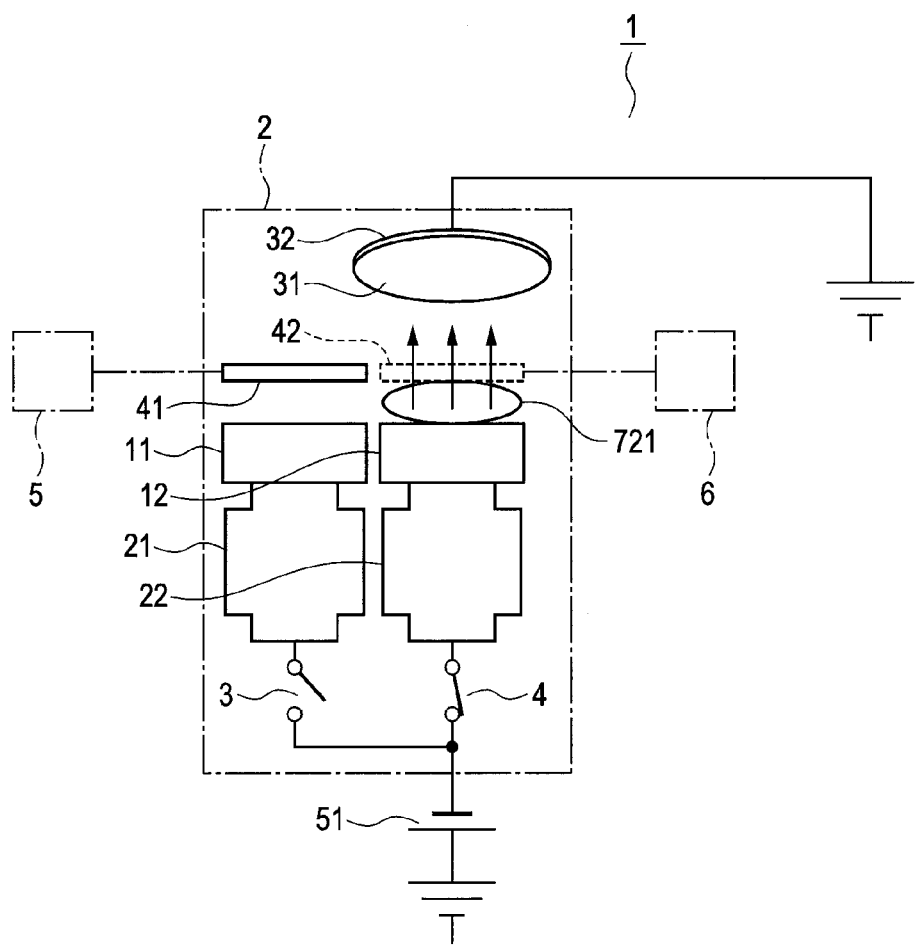
FIG. 1 is a schematic view illustrating a sputtering apparatus according to a first embodiment of the present invention.

The sputtering apparatus (film-forming apparatus) 1 of this embodiment forms a thin film on a substrate (film formation subject) 31 by sputtering, and as illustrated in FIG. 1, includes a vacuum chamber 2 and a substrate holder (holder portion) 32 for holding the substrate 31 in the vacuum chamber. Further, the sputtering apparatus 1 includes multiple (two in this embodiment) cathode mechanisms 21 and 22 for respectively supporting targets 11 and 12 so that the targets 11 and 12 are opposed to the substrate 31 in the vacuum chamber 2.

Further, the sputtering apparatus 1 includes multiple (two in this embodiment) shutters 41 and 42 movable forward and backward individually between the multiple (two in this embodiment) targets 11 and 12 made of different materials and the substrate 31 to block or pass film-forming particles generated from the targets 11 and 12. At least one of the multiple shutters 41 and 42 (shutter 42 in this embodiment) is made of a target material different from the materials for the targets 11 and 12 to be blocked so that the at least one of the multiple shutters 41 and 42 is configured as a shutter that also functions as a target.

Inactive gas such as argon (Ar) is introduced into the vacuum chamber 2 under a state in which the vacuum chamber 2 is exhausted with a decompression pump (not shown) so as to be kept at a predetermined vacuum degree. In an upper part of the vacuum chamber 2, the substrate holder (holder portion) 32 that functions as an anode with one end grounded is placed, and the substrate 31 serving as the film formation subject is removably held by the substrate holder 32. In this embodiment, a lens is used as the substrate 31. A film to be formed on the lens serving as the substrate 31 is an antireflection film of a general optical component, which is a multilayered film made of, for example, $Ta_2O_5$, $SiO_2$, and $Al_2O_3$.

The cathode mechanisms 21 and 22 are placed in a center part of the vacuum chamber 2, and a DC power supply 51, which is capable of applying a high voltage through power supply switches 3 and 4 to be opened or closed by the control portion, is connected to the cathode mechanisms 21 and 22. A negative electrode of the DC power supply 51 is connected to the power supply switches 3 and 4 side, and a positive electrode of the DC power supply 51 is grounded. The cathode mechanisms 21 and 22 are placed in parallel, and the Ta target 11 and the Si target 12 are removably mounted to upper portions of the cathode mechanisms 21 and 22.

In the upper part of the vacuum chamber 2, the shutters 41 and 42 are placed so as to be positioned between the targets 11 and 12 and the substrate 31. The shutter 41 is connected to a driving device 5 placed outside the vacuum chamber 2 and configured so as to move forward and backward (appear and disappear) with a predetermined space ensured above the Ta target 11. Further, the shutter 42 that also functions as a target is connected to a driving device 6 placed outside the vacuum chamber 2 and configured so as to move forward and backward (appear and disappear) with a predetermined space ensured above the Si target 12. The driving devices 5 and 6 for the shutters 41 and 42 respectively include not only opening/closing mechanisms for blocking but also mechanisms for moving the shutters 41 and 42 in a direction normal to a shutter surface (vertical direction in FIG. 1).

The driving device 6 includes the above-mentioned mechanisms, and hence, the shutter 42 that also functions as a target has a function of blocking or passing film-forming particles generated from one corresponding target 12 of the targets 11 and 12 and a function of coming into contact with or being separated from the target 12 between the target 12 and the substrate holder 32. In the sputtering apparatus 1, at the time of sputtering using the shutter 42 that also functions as a target, a voltage is applied to the shutter 42 through the target 12 by operating the driving device 6 to move the shutter 42 to the target 12 side, to thereby bring at least a part of the shutter 42 into contact with the target 12.

At the time of pre-sputtering for cleaning the surface of the target 11 before the start of sputtering, the driving device 5 moves the shutter 41 upward in FIG. 1 so that the shutter 41 is separated from the target 11. Further, at the time of pre-sputtering for cleaning the surface of the target 12 before the start of sputtering, the driving device 6 moves upward the shutter 42 that also functions as a target so that the shutter 42 is separated from the target 12.

Thus, the shutters 41 and 42 are openable and closable respectively by the driving devices 5 and 6 to block particles between the substrate 31 and the targets 11 and 12, and movable in a normal direction (vertical direction in FIG. 1) from the shutter surface. Further, a mask for controlling a film thickness distribution can also be provided between the shutters 41 and 42 and the substrate 31.

In the case of forming a multilayered film made of $Ta_2O_5$, $SiO_2$, and $Al_2O_3$ on the surface of the substrate 31, the film thickness of $Al_2O_3$ may be smaller than those of $Ta_2O_5$ and $SiO_2$ in terms of design of an optical film in many cases.

Considering the above-mentioned fact, it is more preferred to adopt, as the shutter that also functions as a target, a target made of Al having a small wearing ratio of a film-forming material by film formation. Needless to say, a target made of a material other than Al can also be adopted as the shutter that also functions as a target.

Figure 9:
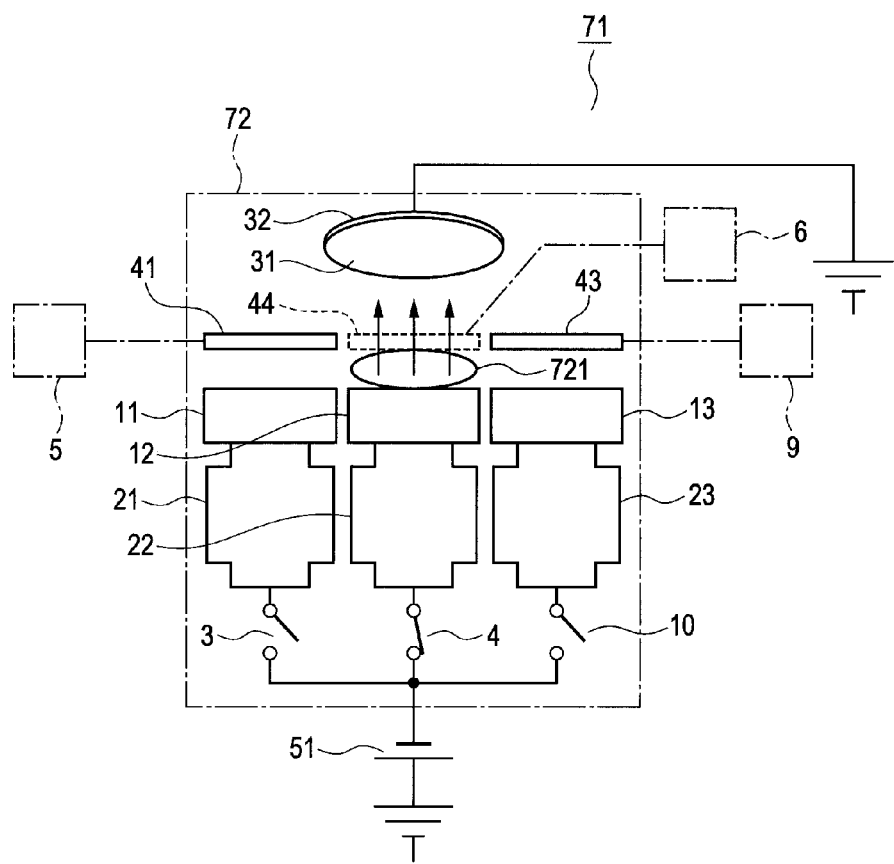
FIG. 9 is a schematic view illustrating a conventional sputtering apparatus.

Thus, in this embodiment, the Al target 13 and the shutter 43 for the Al target 13 in the conventional sputtering apparatus illustrated in FIG. 9 are omitted by using the shutter 42 that also functions as a target made of Al that is a film-forming material. Therefore, the two cathode mechanisms 21 and 22 smaller in number than the three cathode mechanisms 21, 22, and 23 that are required in the conventional example are provided, and the two targets 11 and 12 smaller in number than the three targets 11, 12, and 13 that are required in the conventional example are provided. That is, the shutter 42 that also functions as a target and the target 12 share the cathode mechanism 22, with the result that the configuration of the sputtering apparatus 1 can be simplified significantly.

As described above, SUS stainless steel that is the same material as that for the vacuum chamber 2 is used for the shutter 41 for blocking Ta in this embodiment, but for example, Nb may be used in the case of four kinds of film-forming materials. Further, in the case where the number of the film-forming materials is large, the shutter 42 that also functions as a target may have a multi-stage structure such as a two-layered structure. When the multi-stage structure of the shutter 42 that also functions as a target is used, there is a greater advantage of simplifying the apparatus, compared with the conventional sputtering apparatus.

Further, in the case where it takes a long period of time for sputtering the shutter, a cooling mechanism such as a water-cooling jacket can be mounted on the shutter so as to prevent the shutter from being deformed or dissolved by heating.

Mounting the cooling mechanism leads to the complication of an apparatus configuration, and hence, the shutter 42 that also functions as a target may be formed of at least two materials. At this time, the material for the shutter on the substrate side is different from those for the targets 11 and 12. For example, by forming the shutter 42 that also functions as a target with at least two sheets of plywood to increase the strength, the shutter 42 can be prevented from being deformed, or by forming the shutter 42 that also functions as a target with a crucible and placing a material different from those of the targets 11 and 12 in the crucible, the shutter 42 can be prevented from being melted.

Further, as the material on the target side of the above-mentioned shutter 42 that also functions as a target formed of at least two materials, when the same material as that for the immediately underlying target is used, the target can be prevented from being contaminated. Alternatively, as the material on the target side, also when using a conductive material having a high melting point and a low linear expansion coefficient, such as W, Mo, Ta, C, Ti, Zr, or Fe, and an alloy or a compound of the materials, the target can be prevented from being contaminated.

On the other hand, when the material on the target side of the shutter 42 that also functions as a target formed of at least two materials is sputtered, an impurity may be mixed with the shutter. Therefore, the material on the target side can also be covered with a material different from that for the target, which makes the material on the target side invisible.

As the substrate 31, for example, a glass substrate with a diameter of 200 mm and a thickness of 100 mm is used. The substrate 31 is held by a mechanism (not shown) so as to be rotatable about its axis at the time of film formation. Further, multiple substrates 31 can be used as long as the total size is within the above-mentioned range, and in this case, the substrates 31 revolve instead of rotating about their axes.

In this embodiment, a DC magnetron system using a permanent magnet is used for the cathode mechanisms 21 and 22, but for example, RF (high-frequency) discharge or a conventional system can also be used.

As the targets, for example, the Ta target 11 and the Si target 12 each having a diameter of 8 inches are mounted, and the respective materials are switched so that a film is formed on the substrate 31. The materials for the targets can also be exchanged. The materials are not limited to those described above. For example, in the case of manufacturing an optical component, metals such as Mg, La, Nb, Mo, Ni, Ce, Hf, Ti, Y, W, Ca, Zr, or Gd, and an oxide or a fluoride thereof can be used.

In the sputtering apparatus 1 having the above-mentioned configuration, when the power supply switches 3 and 4 are opened or closed based on the control by the control portion, the following occurs. That is, the plasma 721 is generated on the targets 11 and 12 mounted to the cathode mechanisms 21 and 22 connected to the DC power supply 51, and a thin film starts being formed by sputtering on the substrate 31 held by the substrate holder 32 in the vacuum chamber 2.

Then, ions in the plasma strike the target 12, which is maintained to be negative, to eject atoms from the Si target 12, and the sputtering atoms adhere to the substrate 31 to form a film thereon. Further, when the substrate 31 is moved to the Ta target 11 side and the shutter 41 is opened, ions in the plasma strike the target 11, which is maintained to be negative, to eject atoms from the Ta target 11, and the sputtering atoms adhere to the substrate 31 to form a film thereon.

For example, when the shutter 42 that also functions as a target made of Al is sputtered to form a film on the substrate 31, the driving device 6 is operated by the control portion, and the shutter 42 that also functions as a target is moved downward so as to approach the target 12 and to be brought into contact with the target 12. When the shutter 42 that also functions as a target is sputtered as described above, and when pre-sputtering is performed as described later, the shutter 42 that also functions as a target is closed. However, when sputtering is performed through use of the target 12, the shutter 42 that also functions as a target is opened. Immediately after the exchange or storage under vacuum of the targets 11 and 12, a contaminated layer such as an oxide layer may be formed on the surfaces of the targets 11 and 12. Thus, when sputtering is started as it is, the contaminated layer is also sputtered together with the targets 11 and 12, and a film to be formed on the substrate 31 may contain an impurity. In order to prevent such an inconvenience, the above-mentioned pre-sputtering is performed.

A film-forming process in the case of forming $Al_2O_2$, $Ta_2O_5$, and $SiO_2$ films, including the operations of opening/closing and vertical movement of the shutter, is described with reference to a flowchart of FIG. 4.

At the time of film formation, for example, 50 sccm of Ar gas as sputtering gas and 20 sccm of $O_2$ gas as reactive gas are introduced to the vacuum chamber 2. The electric power applied to the targets 11 and 12 is set to be, for example, 1 kW by the DC power supply 51. Further, a high-frequency wave of the order of 100 kHz may be superimposed, if required, so as to stabilize discharge. The film thickness is controlled with time by the control portion. The process condition of, for example, gas and electric power can be varied depending upon the material and desired film quality.

The film-forming rate of a film formed by the shutter 42 that also functions as a target to be sputtered while being set to be the same potential as that of the target 12 may be decreased to about 10% to 60%, depending upon the material, compared with the case of using the targets 11 and 12 set at the cathode mechanisms 21 and 22. This is because a film-forming system becomes closer to a conventional system due to the shutter 42 separated from a permanent magnet mounted on a cathode. However, for example, in the case of an optical thin film formed in an optical component, if the film is a multilayered film requiring multiple materials, the influence of a reduction in a film-forming rate can also be minimized by forming a film with the shutter 42 that also functions as a target for a material that may be thin.

Figure 4:
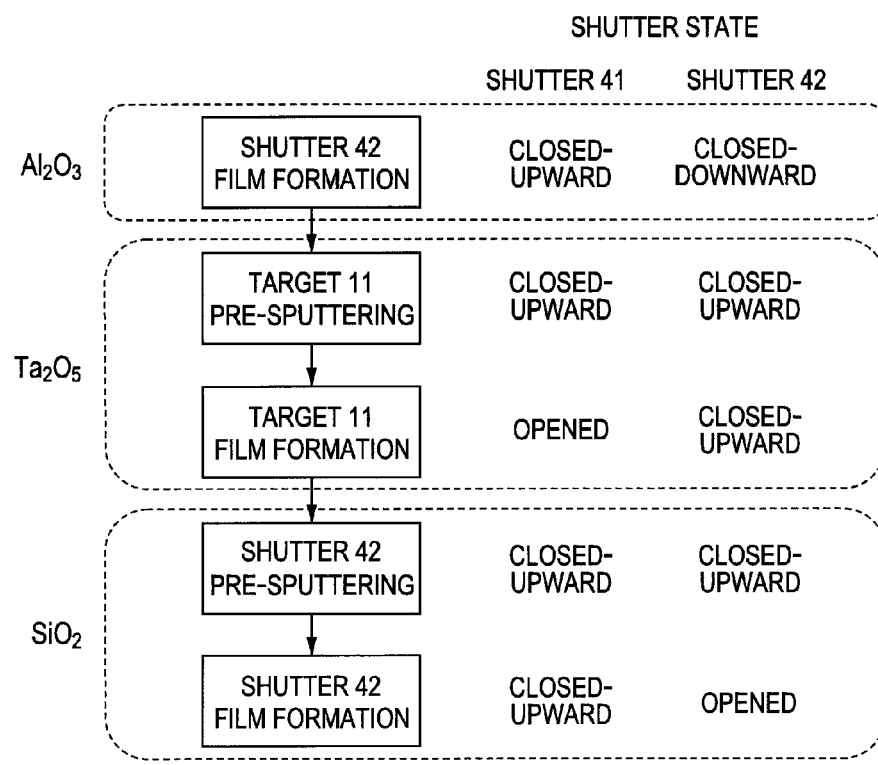
FIG. 4 is a flowchart illustrating operations common to FIGS. 1 to 3.

As illustrated in FIG. 4, in the case where an $Al_2O_3$ film is formed on the substrate 31 through use of the shutter 42 that also functions as a target made of Al, the shutter 41 is moved upward while being closed by the operation of the driving device 5. Then, the shutter 42 that also functions as a target is moved downward while being closed by the operation of the driving device 6.

Then, in the case where pre-sputtering of the target 11 is performed, the shutter 41 is moved upward while being closed by the operation of the driving device 5, and the shutter 42 that also functions as a target is moved upward while being closed by the operation of the driving device 6. In the case where a $Ta_2O_5$ film is subsequently formed on the substrate 31 through use of the target 11, the shutter 41 is opened by the operation of the driving device 5, and the shutter 42 that also functions as a target is moved upward while being closed by the operation of the driving device 6.

Further, in the case where pre-sputtering of the shutter 42 that also functions as a target made of Al is performed, the shutter 41 is moved upward while being closed by the operation of the driving device 5, and the shutter 42 that also functions as a target is moved upward while being closed by the operation of the driving device 6. In the case where an $SiO_2$ film is formed on the substrate 31 through use of the shutter 42 that also functions as a target made of Al, the shutter 41 is moved upward while being closed by the operation of the driving device 5, and the shutter 42 that also functions as a target is opened by the operation of the driving device 6.

Note that, in this embodiment, the positional relationship between the substrate 31 and the targets 11 and 12 can also be set in such a manner that the substrate 31 is moved horizontally in the figure to be placed in front of the targets 11 and 12 or the shutter 42 that also functions as a target made of Al.

Hereinafter, modified examples obtained by modifying the configuration of this embodiment illustrated in FIG. 1 are described with reference to FIGS. 2 and 3.

Figure 2:
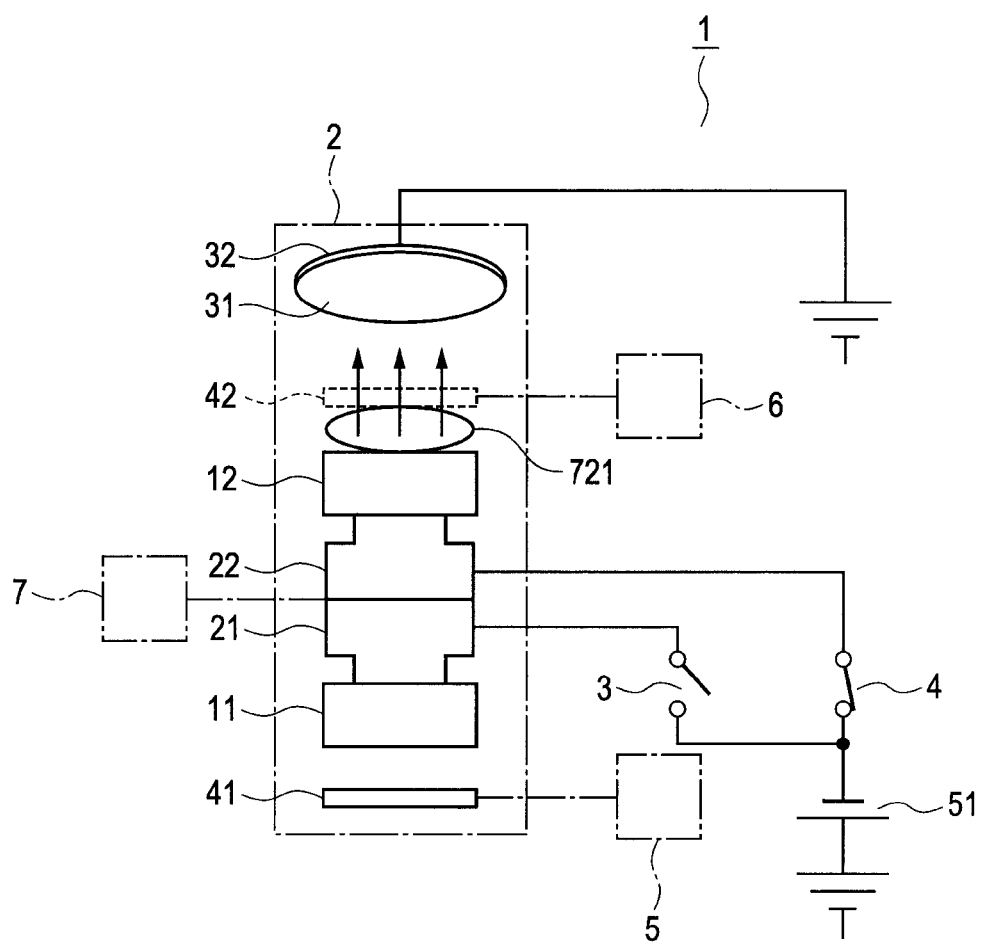
FIG. 2 is a schematic view illustrating a sputtering apparatus according to a second embodiment of the present invention, in which a target is movable.

Modified Example 1 illustrated in FIG. 2 is configured so that the targets 11 and 12 are rotated. That is, the cathode mechanisms 21 and 22, to which the targets 11 and 12 are respectively mounted, are coupled to each other with back sides facing each other in a vertical direction and are rotated with respect to the substrate 31 by a driving device 7 so as to be opposed to the substrate 31, individually. In this case, the cathode mechanism 21, the target 11, the shutter 41, and the driving device 5, and the cathode mechanism 22, the target 12, the shutter 42 that also functions as a target, and the driving device 6 are respectively configured so as to be rotated integrally by the driving device 7. The DC power supply 51 is connected to the cathode mechanisms 21 and 22 through the power supply switches 3 and 4, respectively.

Figure 3:
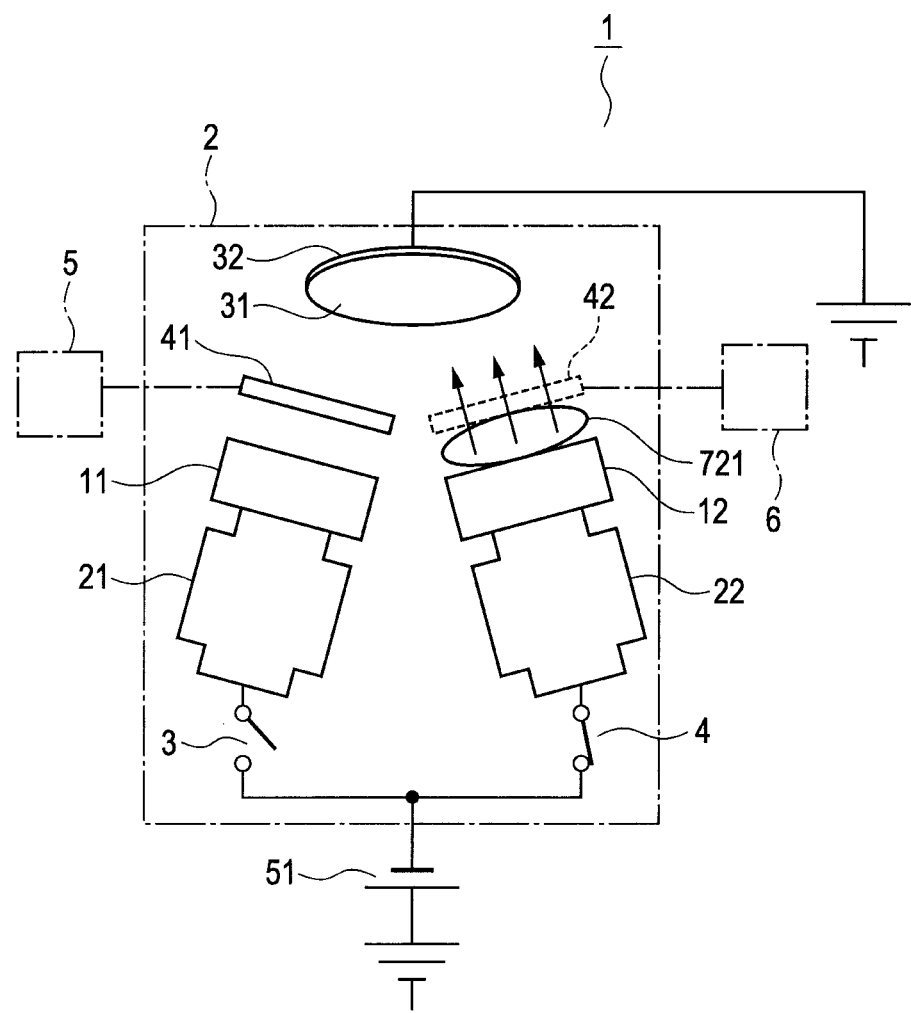
FIG. 3 is a schematic view illustrating a sputtering apparatus according to a third embodiment of the present invention, in which the target is fixed and directed diagonally.

Further, in Modified Example 2 illustrated in FIG. 3, the targets 11 and 12 are respectively placed so as to be tilted toward the substrate 31 so that the substrate 31 and the targets 11 and 12 may not be moved. That is, the cathode mechanisms 21 and 22 to which the targets 11 and 12 are respectively mounted are placed so as to be tilted toward the substrate 31 at an upper center, and the shutter 41 and the shutter 42 that also functions as a target made of Al are operated by the driving devices 5 and 6, respectively. The DC power supply 51 is connected to the cathode mechanisms 21 and 22 through the power supply switches 3 and 4, respectively.

Even in Modified Examples 1 and 2 described above, sputtering and pre-sputtering can be performed in the same way as in the sputtering apparatus 1 of the embodiment illustrated in FIG. 1, and the effects similar to those in the embodiment illustrated in FIG. 1 can be exhibited.

According to the embodiment and Modified Examples 1 and 2 described above, through use of the shutter 42 that originally accompanies the sputtering apparatus as the shutter 42 that also functions as a target, there is no risk that a complicated cathode mechanism is separately prepared to enlarge an apparatus. This can prevent the complication of an apparatus mechanism to simplify the mechanism and prevent an increase in an apparatus cost.

Hereinafter, examples using the sputtering apparatus 1 according to the present invention are described with reference to FIGS. 5 to 8. In FIGS. 5 to 8, portions common to those illustrated in FIGS. 1 to 3 are denoted with the same reference numerals as those in FIGS. 1 to 3, and the description thereof is omitted.

Example 1

In Example 1, a sputtering apparatus is used, in which a basic apparatus form is the above-mentioned DC magnetron system, Ta is used as the target 11, Si is used as the target 12, Al is used as the shutter 42 that also functions as a target, and SUS stainless steel that is the same material as that of the vacuum chamber 2 is used to form the shutter 41.

Figure 5:
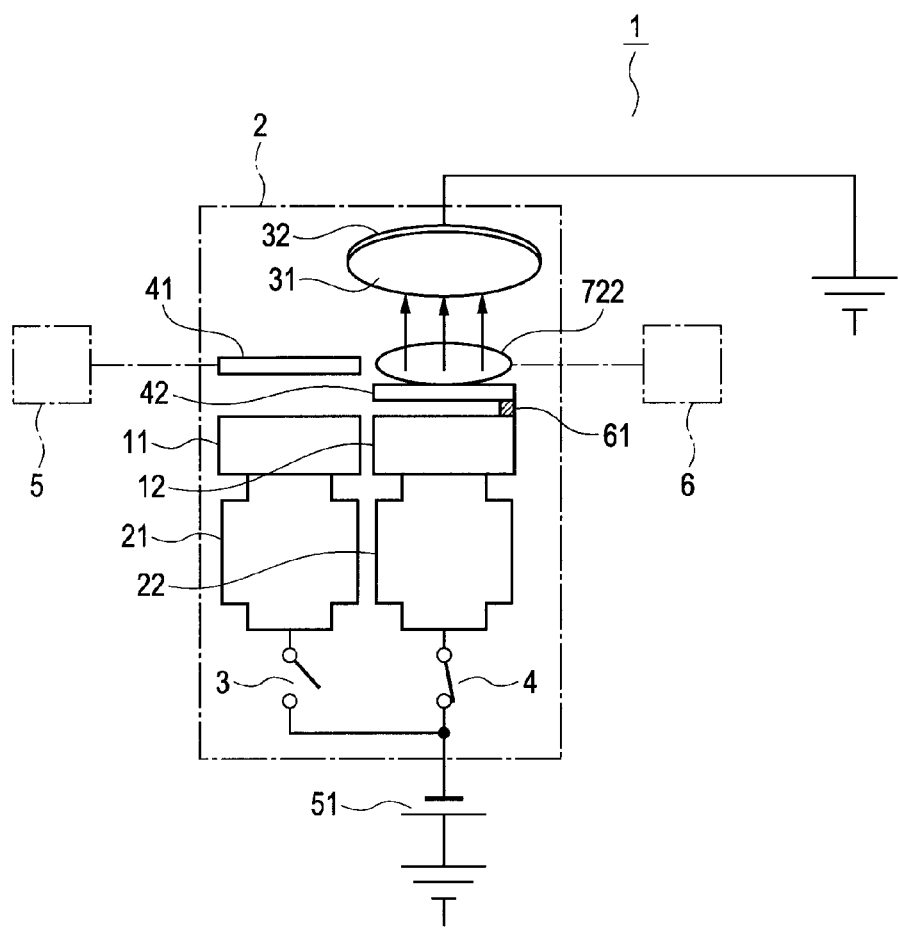
FIG. 5 is a schematic view illustrating a sputtering apparatus according to Example 1 of the present invention, which uses the configuration of FIG. 1.

The shutter 42 that also functions as a target made of Al is sputtered to form a film on the substrate 31 as follows. As illustrated in FIG. 5, the shutter 42 that also functions as a target is moved downward while being closed so that the distance between the shutter 42 that also functions as a target and the target 12 is equal or less than a Debye length.

Here, the Debye length is about 0.1 mm to 5 mm under the glow discharge condition generally used in sputtering, although it depends upon the process condition of film formation. The plasma 721 is not generated between the shutter 42 that also functions as a target and the target 12 by setting the distance between the shutter 42 that also functions as a target and the target 12 to be equal to or less than the Debye length. Thus, Al of the shutter 42 that also functions as a target is allowed to reach only the substrate 31 without contaminating Si of the target 12.

In Example 1, the shutter 42 that also functions as a target has a conductive protrusion 61 on a surface facing the target 12 side and is brought into conduction by coming into contact with the target 12 through the protrusion 61. The length of the protrusion 61 is set to be equal to or less than the Debye length. That is, the surface of the shutter 42 that also functions as a target on the target 12 side is provided with the protrusion 61 protruding vertically to the surface. The length of the protrusion 61 in the vertical direction is equal to or less than the Debye length and is the same as the distance between the shutter 42 that also functions as a target and the target 12. At the time of sputtering of the shutter 42 that also functions as a target, the protrusion 61 comes into contact with the target 12, whereby the shutter 42 that also functions as a target and the target 12 are set to be the same potential.

Consequently, the same voltage as that of the target 12 is also applied to the shutter 42 that also functions as a target, and plasma 722 is generated on the substrate side of the shutter 42 that also functions as a target. Therefore, an Al$_2$O$_3$ film is formed on the substrate 31. At this time, sputtering through use of the shutter 42 that also functions as a target becomes close to a state in the conventional system, and thus a film-forming rate is reduced. However, the Al$_2$O$_3$ film has a thickness of 10% or less of the entire film thickness of the multilayered film, and hence the influence on the entire film-forming process is small.

Example 2

The basic apparatus form of Example 2 is the same as that of Example 1.

Figure 6:
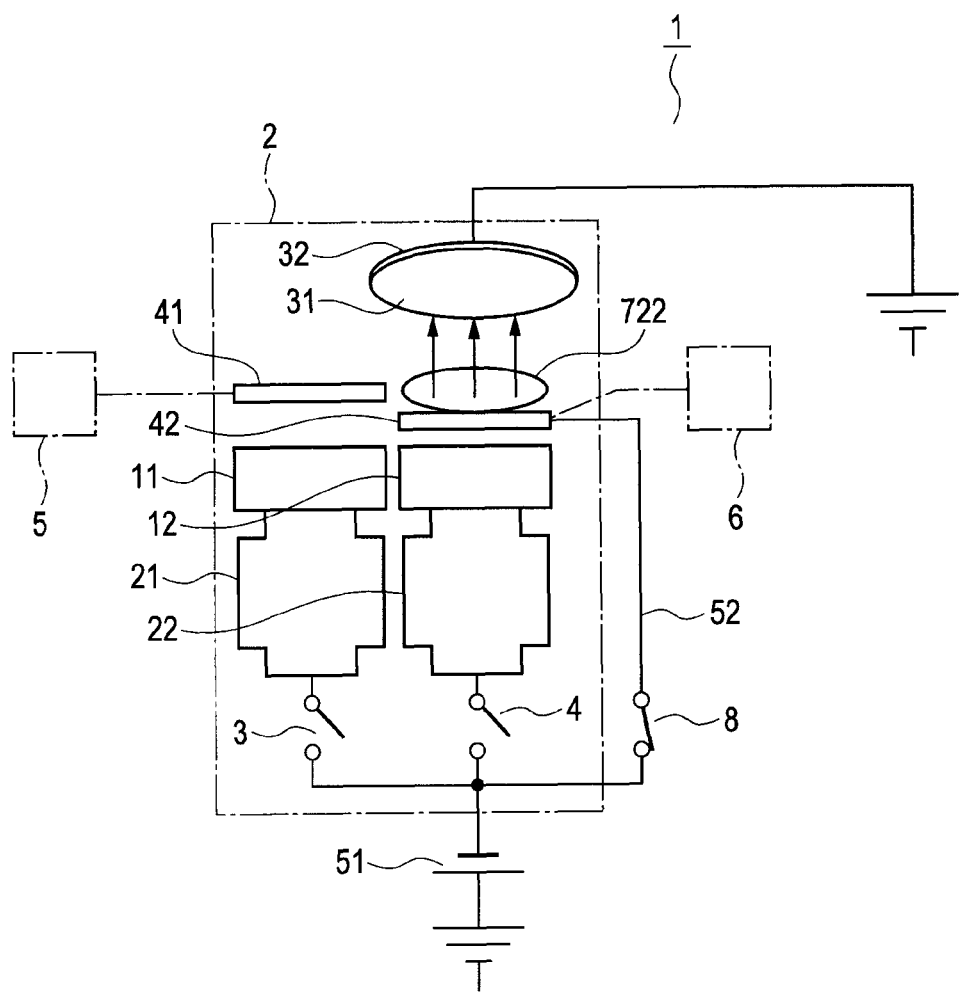
FIG. 6 is a schematic view illustrating a sputtering apparatus according to Example 2 of the present invention, which uses the configuration of FIG. 1.

The shutter 42 that also functions as a target made of Al is sputtered to form a film on the substrate 31 as follows. As illustrated in FIG. 6, the shutter 42 that also functions as a target is moved downward while being closed so that the distance between the shutter 42 that also functions as a target and the target 12 is equal or less than the Debye length.

Here, the Debye length is about 0.1 mm to 5 mm under the glow discharge condition generally used in sputtering, although it depends upon the process condition of film formation. The plasma 721 is not generated between the shutter 42 that also functions as a target and the target 12 by setting the distance between the shutter 42 that also functions as a target and the target 12 to be equal to or less than the Debye length. Thus, Al of the shutter 42 that also functions as a target is allowed to reach only the substrate 31 without contaminating Si of the target 12.

In this example, a voltage is directly applied to the shutter 42 that also functions as a target through a wire 52 from the DC power supply 51 that supplies a voltage to the cathode mechanism 22 corresponding to the target 12. That is, the DC power supply 51 used for the target 12 is connected to the shutter 42 that also functions as a target through the wire 52, and a voltage from the DC power supply 51 is applied to the shutter 42 that also functions as a target. Besides this configuration, a power supply different from the DC power supply 51 can be provided separately so that a voltage can be applied to the shutter 42 that also functions as a target from the power supply.

In this example, a voltage is directly applied to the shutter 42 that also functions as a target, and the plasma 722 is generated on the substrate 31 side of the shutter 42 that also functions as a target, whereby an Al$_2$O$_3$ film is formed on the substrate 31. At this time, sputtering through use of the shutter 42 that also functions as a target becomes close to a state in the conventional system, and thus a film-forming rate is reduced. However, the Al$_2$O$_3$ film has a thickness of 10% or less of the entire film thickness of the multilayered film, and hence the influence on the entire film-forming process is small.

Example 3

The basic apparatus form of Example 3 is the same as that of Example 1.

Figure 7:
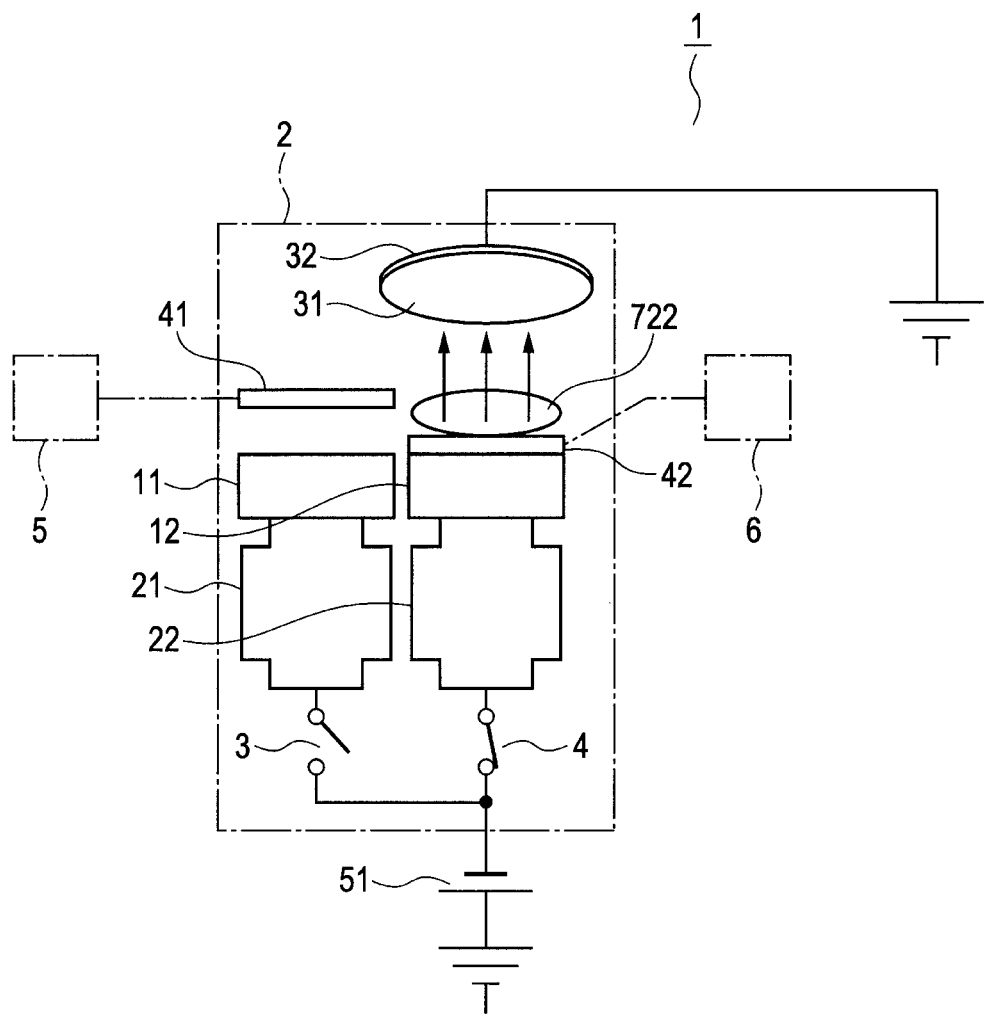
FIG. 7 is a schematic view illustrating a sputtering apparatus according to Example 3 of the present invention, which uses the configuration of FIG. 1.

In Example 3, the shutter 42 that also functions as a target is brought into conduction by bringing the surface facing the target 12 side into direct contact with the target 12. The shutter 42 that also functions as a target made of Al is sputtered to form a film on the substrate 31 as follows. As illustrated in FIG. 7, the shutter 42 that also functions as a target is brought into direct contact with the target 12 while being closed, whereby the shutter 42 and the target 12 are set to be the same potential. In this case, both the shutter 42 and the target 12 are brought into contact with each other over the entire surface and there is no space therebetween, and hence the plasma 721 is not generated between the shutter that also functions as a target and the target 12. Therefore, Al of the shutter 42 that also functions as a target is allowed to reach only the substrate 31 without contaminating Si of the target 12.

Consequently, a voltage is also applied to the shutter 42 that also functions as a target through the Si target 12, and the plasma 722 is generated on the substrate 31 side of the shutter 42 that also functions as a target. Therefore, an Al$_2$O$_3$ film is formed on the substrate 31. At this time, sputtering through use of the shutter 42 that also functions as a target becomes close to a state in the conventional system, and hence a film-forming rate is reduced. However, the Al$_2$O$_3$ film has a thickness of 10% or less of the entire film thickness of the multilayered film, and hence the influence on the entire film-forming process is small.

Example 4

The basic apparatus form of Example 4 is the same as that of Example 1.

Figure 8:
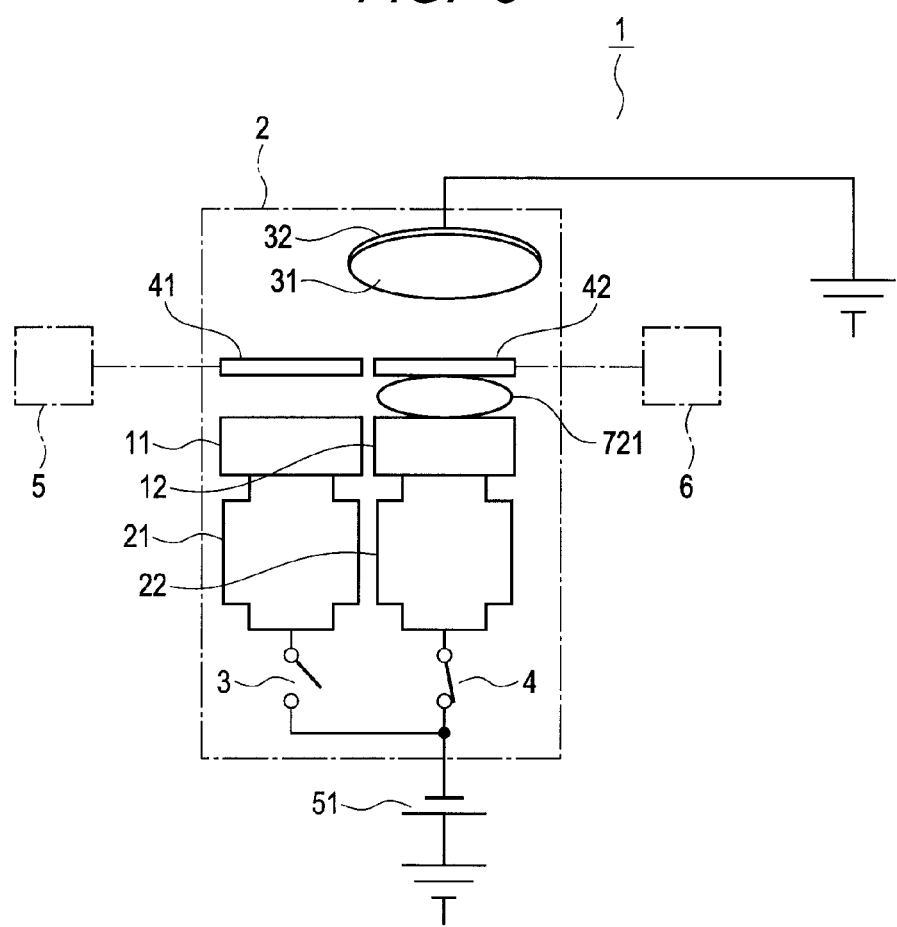
FIG. 8 is a schematic view illustrating a sputtering apparatus according to Example 4 of the present invention, which uses the configuration of FIG. 1.

In Example 4, the shutter 42 that also functions as a target is separated from one corresponding target 12 at the time of pre-sputtering before the start of sputtering. Then, the distance between the shutter 42 that also functions as a target and the target 12 is set to a dimension exceeding the Debye length. That is, pre-sputtering for cleaning the surface of the target 12 before the start of sputtering is performed as follows. As illustrated in FIG. 8, the shutter 42 that also functions as a target is moved upward while being closed so that the distance between the shutter 42 that also functions as a target and the target 12 is set to a dimension exceeding the Debye length.

Here, the Debye length is about 0.1 mm to 5 mm under the glow discharge condition generally used also in sputtering, although it depends upon the process condition of film formation. The plasma 721 is generated between the shutter 42 that also functions as a target and the target 12 by setting the distance between the shutter 42 that also functions as a target and the target 12 to a value exceeding the Debye length, whereby pre-sputtering of Si of the target 12 can be performed. Consequently, the shutter 42 that also functions as a target acts as a blocking body of film-forming particles from the target 12, and the surface of the target 12 can be cleaned.

Example 5

Figure 10:
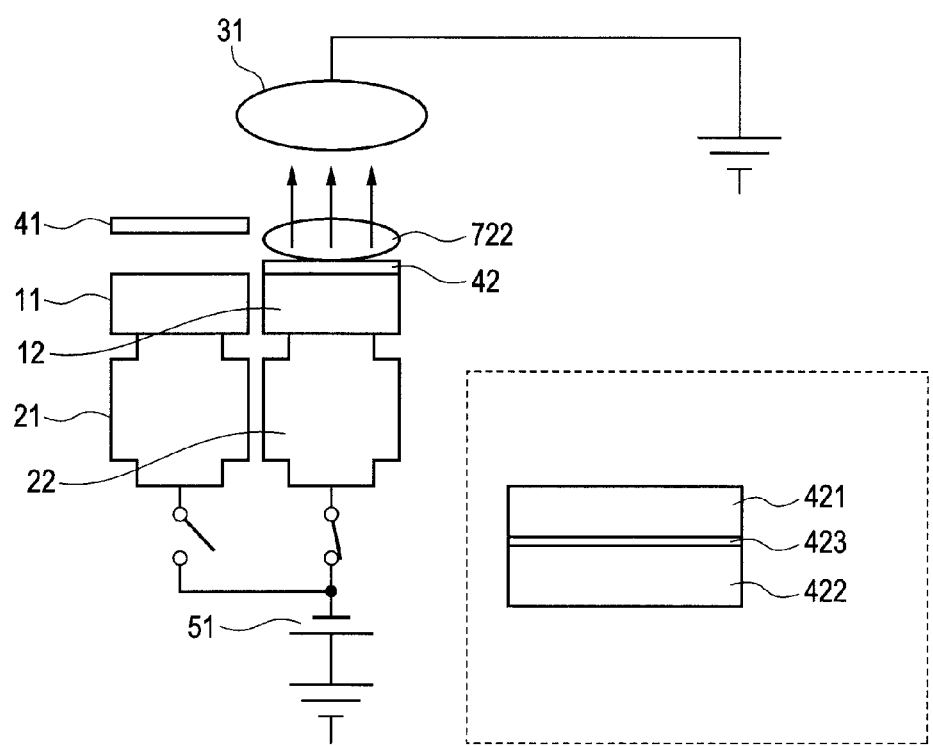
FIG. 10 is a schematic view illustrating a sputtering apparatus according to Example 5 of the present invention, which uses the configuration of FIG. 1.

In Example 5, as illustrated in FIG. 10, the basic apparatus form is the same as that of Example 1 except that Si is used for the target 11 and Ta is used for the target 12. Example 5 relates to the configuration of the shutter 42 that also functions as a target itself. As an actual embodiment, the effects are exhibited in all Examples 1 to 4 described above. The maximum effect is exhibited in the case of the form of Example 3 in which the shutter 42 that also functions as a target is brought into direct contact with the target 12 and the shutter 42 that also functions as a target may contaminate the targets 11 and 12.

The shutter 42 that also functions as a target is formed of at least two materials. At this time, a material 421 for the shutter 42 that also functions as a target on the substrate 31 side is different from those for the targets 11 and 12.

The shutter 42 that also functions as a target is formed of at least two laminated sheets so as to be prevented from being deformed by heat. In this case, a material 422 for the shutter 42 that also functions as a target on the target 12 side is formed of a conductive material having a high melting point and a low linear expansion coefficient so that the material 422 is prevented from being melted or deformed by heat. It is preferred that the material 422 be the same as that for the target 12. Ta is used in this example.

The materials 421 and 422 are bonded to each other chemically, and for example, a third material 423 for bonding such as In is used.

Consequently, the shutter 42 that also functions as a target can be prevented from being deformed by heat because the shutter 42 that also functions as a target is formed of at least two laminated sheets and the material 422 has a low linear expansion coefficient. Further, by forming the material 422 of Ta, the target 12 can also be prevented from being contaminated when the material 422 comes into direct contact with the target 12.

Example 6

The basic apparatus form of Example 6 is the same as that of Example 5.

Figure 11:
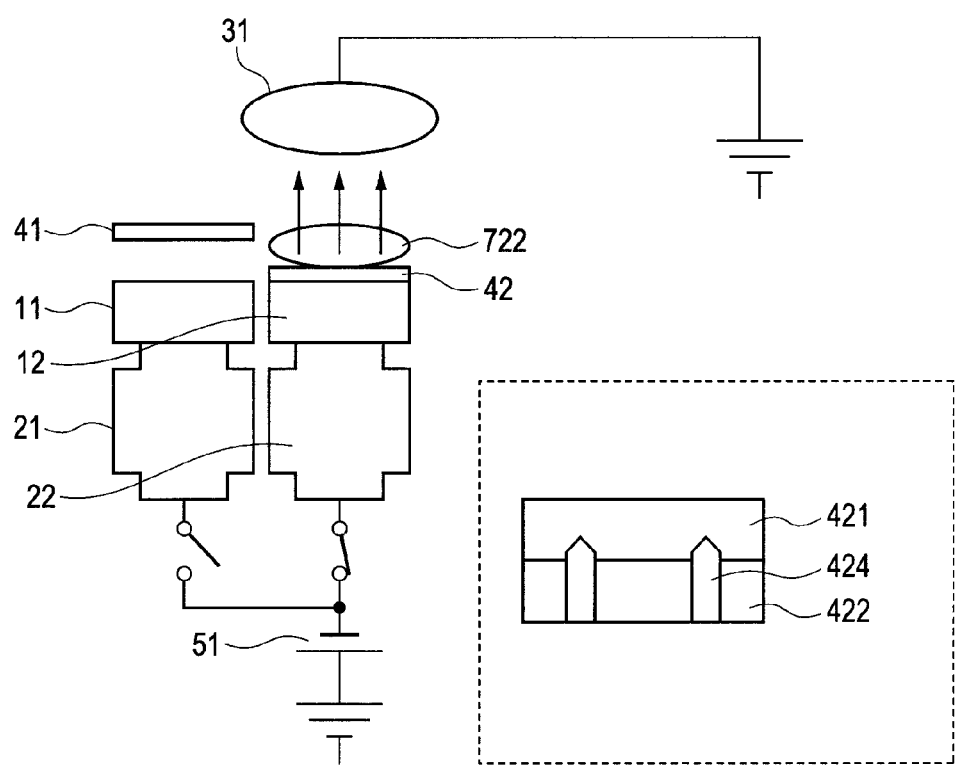
FIG. 11 is a schematic view illustrating a sputtering apparatus according to Example 6 of the present invention, which uses the configuration of FIG. 1.

The shutter 42 that also functions as a target is formed of at least two materials. At this time, as illustrated in FIG. 11, the material 421 for the shutter 42 that also functions as a target on the substrate 31 side is different from those for the targets 11 and 12.

The shutter 42 that also functions as a target is formed of at least two laminated sheets so as to be prevented from being deformed by heat. In this case, the material 422 for the shutter 42 that also functions as a target on the target 12 side is formed of a conductive material having a high melting point and a low linear expansion coefficient so that the material 422 is prevented from being melted or deformed by heat. It is preferred that the material 422 be the same as that for the target 12. Ta is used in this example.

The materials 421 and 422 are bonded to each other mechanically, and for example, bolts 424 are used for bonding.

Consequently, the shutter 42 that also functions as a target can be prevented from being deformed by heat because the shutter 42 that also functions as a target is formed of at least two laminated sheets and the material 422 has a low linear expansion coefficient. Further, by forming the material 422 of Ta, the target 12 can also be prevented from being contaminated when the material 422 comes into direct contact with the target 12.

Example 7

The basic apparatus form of Example 7 is the same as that of Example 5.

Figure 12:
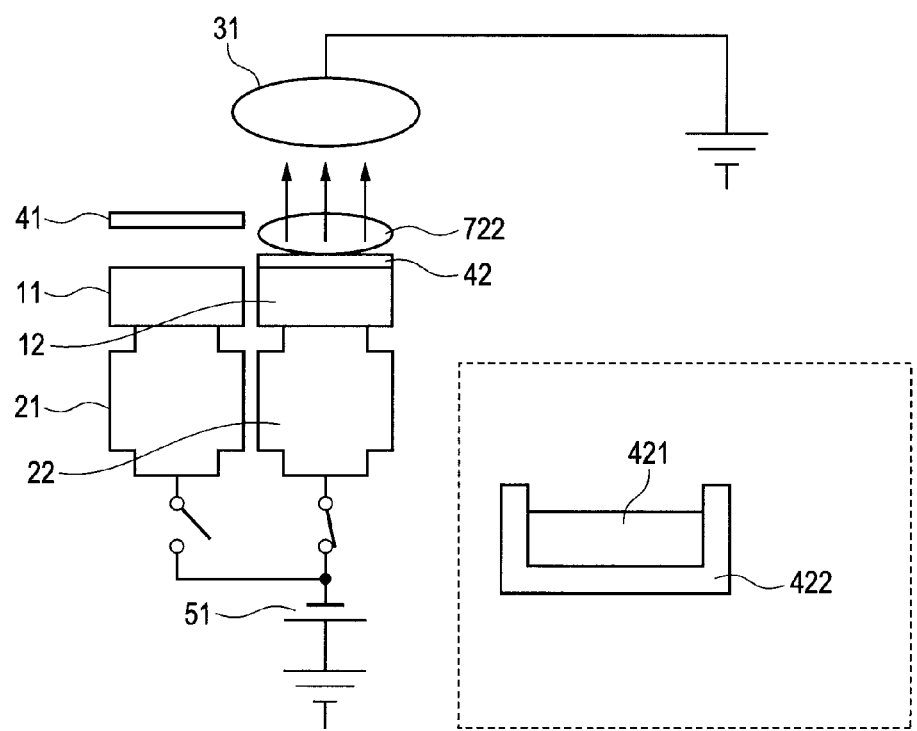
FIG. 12 is a schematic view illustrating a sputtering apparatus according to Example 7 of the present invention, which uses the configuration of FIG. 1.

The shutter 42 that also functions as a target is formed of at least two materials. At this time, as illustrated in FIG. 12, the material 421 for the shutter 42 that also functions as a target on the substrate 31 side is different from those for the targets 11 and 12.

In order to prevent the loss of a shutter function in the case where the shutter 42 that also functions as a target is melted, the shutter 42 that also functions as a target is formed into a crucible form, and the material 421 that is different from those for the targets 11 and 12 is placed in the crucible. The material 422 to be the crucible is formed of a conductive material having a high melting point and a low linear expansion coefficient so that the material 422 is not melted or deformed by heat. It is preferred that the material 422 be the same as that for the target 12. Ta is used in this example. Further, by bonding the material 422 to be the crucible to the material 421 by the methods as described in Examples 5 and 6, the material 421 can be prevented from being deformed by heat.

The end of the crucible is set to be higher than the height of the material 421, whereby the material 421 is prevented from overflowing the crucible to the periphery even when being melted.

Consequently, by forming the shutter 42 that also functions as a target into a crucible form, the shutter 42 that also functions as a target can be used without losing a shutter function even when being melted by heat. Further, by forming the material 422 of Ta, the target 12 can also be prevented from being contaminated when the material 422 comes into direct contact with the target 12.

Example 8

The basic apparatus form of Example 8 is the same as that of Example 5.

Figure 13:
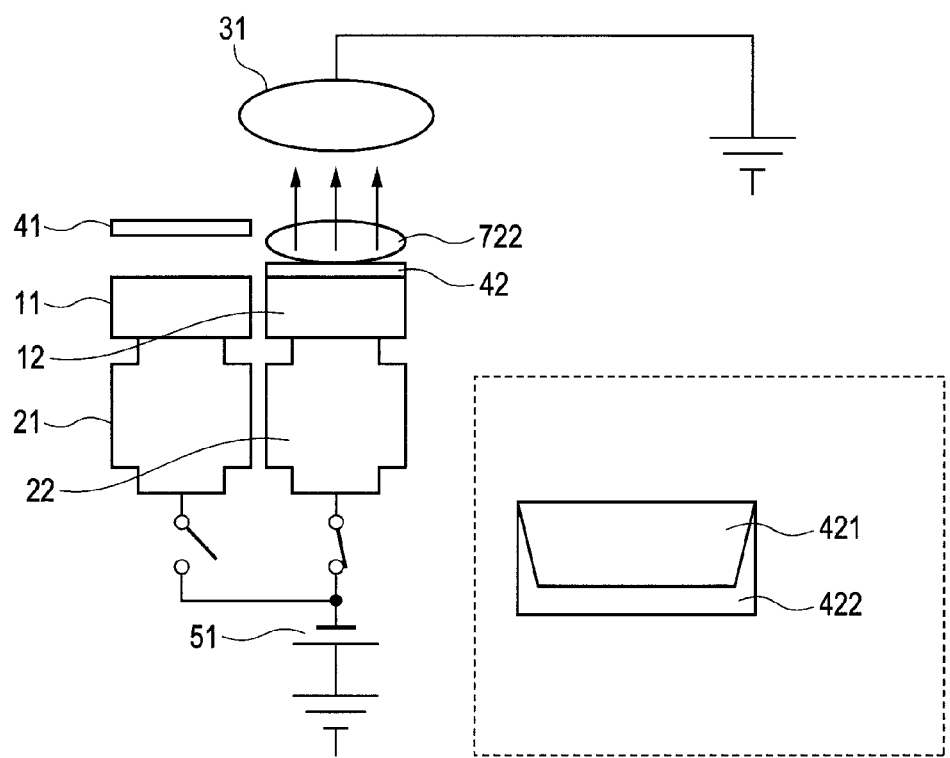
FIG. 13 is a schematic view illustrating a sputtering apparatus according to Example 8 of the present invention, which uses the configuration of FIG. 1.

The shutter 42 that also functions as a target is formed of at least two materials. At this time, as illustrated in FIG. 13, the material 421 for the shutter 42 that also functions as a target on the substrate 31 side is different from those for the targets 11 and 12.

In order to prevent the loss of a shutter function in the case where the shutter 42 that also functions as a target is melted, the shutter 42 that also functions as a target is formed into a crucible form, and the material 421 that is different from those for the targets 11 and 12 is placed in the crucible. The material 422 to be the crucible is formed of a conductive material having a high melting point and a low linear expansion coefficient so that the material 422 is not melted or deformed by heat. It is preferred that the material 422 be the same as that for the target 12. Ta is used in this example. Further, by bonding the material 422 to be the crucible to the material 421 by the methods as described in Examples 5 and 6, the material 421 can be prevented from being deformed by heat.

An edge of an end portion of the crucible is terminated at a tip end, and thus the material 421 can be prevented from overflowing the material 422 to the periphery when being melted, sputtering of the material 422 from the edge surface can be prevented, and the impurity contamination of the shutter 42 that also functions as a target by the material 422 at the time of film formation can be reduced.

Consequently, by forming the shutter 42 that also functions as a target into a crucible form, the shutter 42 that also functions as a target can be used without losing a shutter function even when being melted by heat. Further, by forming the material 422 of Ta, the target 12 can also be prevented from being contaminated when the material 422 comes into direct contact with the target 12.

Example 9

The basic apparatus form of Example 9 is the same as that of Example 5.

Figure 14:
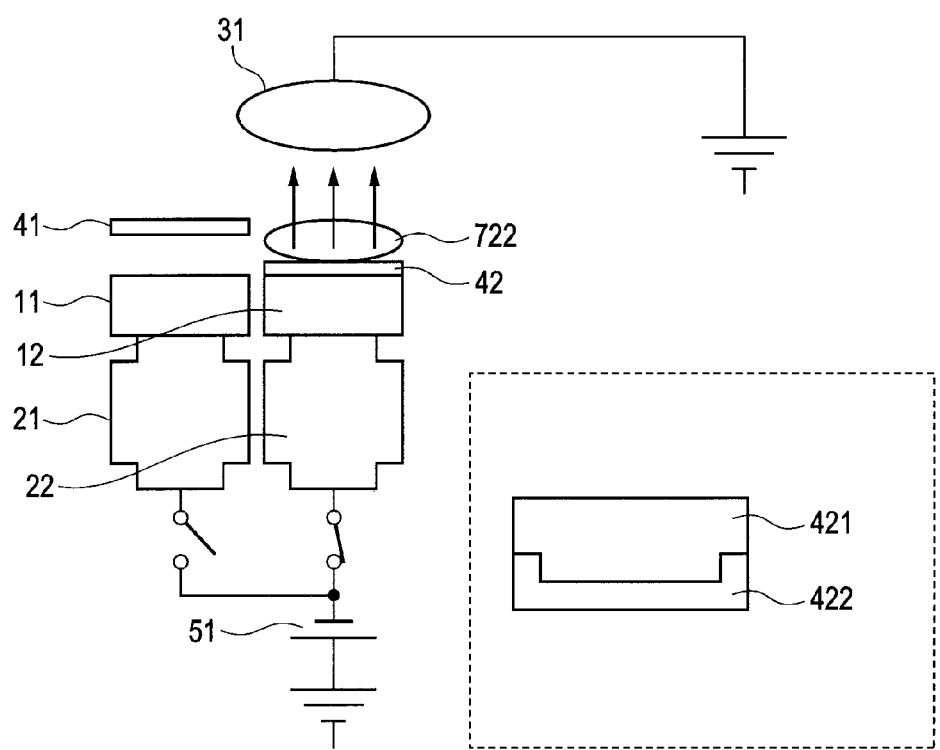
FIG. 14 is a schematic view illustrating a sputtering apparatus according to Example 9 of the present invention, which uses the configuration of FIG. 1.

The shutter 42 that also functions as a target is formed of at least two materials. At this time, as illustrated in FIG. 14, the material 421 for the shutter 42 that also functions as a target on the substrate 31 side is different from those for the targets 11 and 12.

A material different from those for the targets 11 and 12 is placed as the material 421 for the shutter 42 that also functions as a target on the substrate 31 side, and the material 421 for the shutter is sputtered, whereby a film is formed. However, it should also be noted that an edge surface 4221 and a side surface 4222 of the material 422 are sputtered, as described in Example 8.

Thus, the area of the material 421 is set to be the same as or larger than that of the material 422 on a sputtering surface of the shutter 42 that also functions as a target. This can prevent particles generated by sputtering from the side surface 4222 from reaching the substrate 31. This means can be used simultaneously with Examples 5 and 6. Further, when this means is used simultaneously with the crucible-form shutter of Example 7 as illustrated in FIG. 14, sputtering from the edge surface 4221 can be omitted although only deformation by heat can be prevented.

Consequently, the deformation by heat and the contamination of the target 12 in the case of the direct contact between the target 12 and the shutter 42 can be prevented, and the impurity contamination at the time of film formation by the material other than the material 421 can be reduced.

Example 10

The basic apparatus form of Example 10 is the same as that of Example 5.

Figure 15:
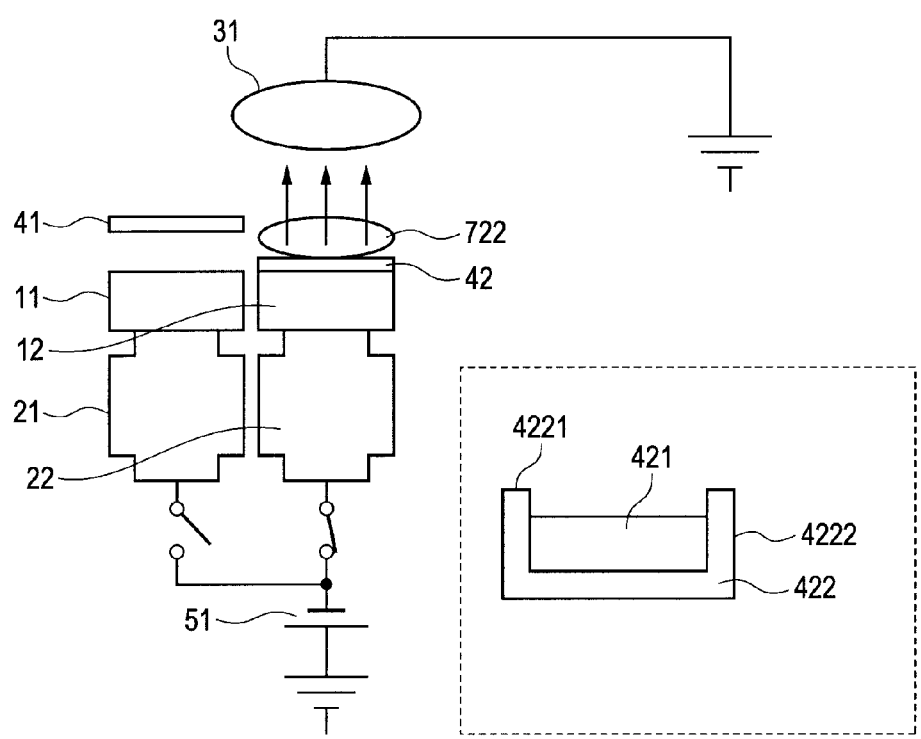
FIG. 15 is a schematic view illustrating a sputtering apparatus according to Example 10 of the present invention, which uses the configuration of FIG. 1.

The shutter 42 that also functions as a target is formed of at least two materials. At this time, as illustrated in FIG. 15, the material 421 for the shutter 42 that also functions as a target on the substrate 31 side is different from those for the targets 11 and 12.

A material different from those for the targets 11 and 12 is placed as the material 421 for the shutter 42 that also functions as a target on the substrate 31 side, and the material 421 for the shutter is sputtered, whereby a film is formed. However, it should also be noted that the edge surface 4221 and the side surface 4222 of the material 422 are sputtered, as described in Example 8.

Thus, in the portions other than the material 421 in the shutter 42 that also functions as a target, the surface on the substrate 31 side such as the edge surface 4221 and the side surface 4222 are covered with the material 421. This means is used simultaneously with Examples 5, 6, 7, 8, and 9. FIG. 15 illustrates a combination with Example 7.

Consequently, the shutter 42 that also functions as a target can be prevented from being deformed by heat or losing a shutter function even when being melted by heat, and the contamination of the target 12 in the case of the direct contact between the target 12 and the shutter 42 and the impurity contamination at the time of film formation by the material other than the material 421 can be reduced.

As described above, according to a sputtering method (film-forming method) using the sputtering apparatus 1, the targets 11 and 12 made of different materials are used, which are respectively supported by the cathode mechanisms 21 and 22 so as to be capable of opposing to the substrate 31 held by the substrate holder 32 in the vacuum chamber 2. Then, the shutters 41 and 42 are allowed to move forward and backward individually between the substrate 31 and the respective targets 11 and 12, whereby film-forming particles generated from the respective targets 11 and 12 are blocked or passed to form a thin film on the substrate 31 by sputtering. In this film-forming method, at least one of the shutters 41 and 42 (for example, shutter 42) is formed of a target material different from those for the targets 11 and 12, and sputtering is performed by using the shutter 42 as a shutter that also functions as a target.

Therefore, through use of a shutter that originally accompanies a sputtering apparatus as the shutter 42 that also functions as a target, there is no risk that a complicated cathode mechanism is prepared separately to enlarge an apparatus. This can prevent the complication of an apparatus mechanism to simplify the mechanism and prevent an increase in an apparatus cost.

Example 11

The basic apparatus form of Example 11 is the same as that of Example 1.

In Example 11, the shutter 42 that also functions as a target is brought into conduction by bringing the surface of the shutter 42 facing the target 12 side into direct contact with the target 12. The shutter 42 that also functions as a target made of Al is sputtered to form a film on the substrate 31 as follows. As illustrated in FIG. 7, the shutter 42 that also functions as a target is brought into direct contact with the target 12 while being closed to set the shutter 42 and the target 12 to be the same potential.

In this case, the shutter 42 and the target 12 come into contact with each other over the entire surface. However, actually, for example, the wearing and deformation by heat of the shutter 42 and the change in shape of the target 12 caused by wearing may occur. Therefore, even if the shutter 42 is lowered by an up-down mechanism, the shutter 42 may not be brought into contact with the target 12 over the entire surface without any gap. If there is a gap between the shutter 42 and the target 12, a discharge voltage varies depending on the width of the gap, and a film-forming speed does not become constant. In view of this, the shutter 42 is provided with an open/close mechanism for blocking and an up-down mechanism for separation, and in addition, the driving device 6 is provided with a tilt and shift mechanism capable of adjusting a tilt angle of the shutter 42. The tilt and shift mechanism changes the tilt of the shutter 42 according to the deformation of the shutter and the change in shape of the target 12, thereby enabling the shutter 42 and the target 12 to come into contact with each other over the entire surface without any gap.

In this case, the shutter 42 and the target 12 come into contact with each other over the entire surface without any gap, and hence the plasma 721 is not generated between the shutter 42 that also functions as a target and the target 12. Therefore, Al of the shutter 42 that also functions as a target is allowed to reach only the substrate 31 without contaminating Si of the target 12.

Consequently, a voltage is also applied to the shutter 42 that also functions as a target through the Si target 12, and the plasma 722 is generated on the substrate 31 side of the shutter 42 that also functions as a target. Therefore, an $Al_2O_3$ film is formed on the substrate 31. At this time, sputtering through use of the shutter 42 that also functions as a target becomes close to a state in the conventional system, and thus a film-forming rate is reduced. However, the $Al_2O_3$ film has a thickness of 10% or less of the entire film thickness of the multi-layered film, and hence the influence on the entire film-forming process is small.

REFERENCE SIGNS LIST

1 . . . film-forming apparatus (sputtering apparatus), 2 . . . vacuum chamber, 5, 6 . . . driving device, 11, 12 . . . target, 21, 22 . . . cathode mechanism, 31 . . . film formation subject (substrate), 32 ... holder portion (substrate holder), 41 ... shutter, 42 ... shutter (shutter that also functions as target), 51 ... DC power supply (power supply), 52 ... wire, 61 ... conductive protrusion, 421 ... material for shutter on substrate side, 422 ... material for shutter on target side, 423 ... third material for shutter, 424 ... bolt, 4221 ... edge surface formed of material other than that for shutter on substrate side, 4222 ... side surface formed of material other than that for shutter on substrate side While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-021465, filed Feb. 3, 2011, and Japanese Patent Application No. 2012-013169, filed Jan. 25, 2012 which are hereby incorporated by reference herein in their entirety.

What is claimed is:

1. A film-forming apparatus for forming a thin film on a film formation subject by sputtering comprising:
   a vacuum chamber;
   a holder portion for holding the film formation subject in the vacuum chamber;
   multiple cathode mechanisms for respectively supporting targets made of materials different from each other so that the targets are opposed to the film formation subject in the vacuum chamber; and
   multiple shutters, which correspond to respective targets, movable forward and backward individually between the targets and the film formation subject to one of block and pass film-forming particles generated from the targets,
   wherein at least one of the multiple shutters is formed of a target material different from the materials for the plurality of the targets so that the at least one of the multiple shutters is configured as a shutter that also functions as a target, and
   wherein each of the targets supported by the multiple cathode mechanisms and the at least one of the multiple shutters formed of a target material are used as a target to conduct the sputtering in turn.

2. The film-forming apparatus according to claim 1, wherein the shutter that also functions as a target is configured so as to perform, between one corresponding target in the plurality of the targets and the holder portion, an operation of one of blocking and passing film-forming particles generated from the one corresponding target and an operation of one of coming into contact with and being separated from the one corresponding target.

3. The film-forming apparatus according to claim 2, wherein, at the time of sputtering using the shutter that also functions as a target, the shutter that also functions as a target is moved to the one corresponding target side so that at least a part of the shutter that also functions as a target is brought into contact with the one corresponding target, to thereby apply a voltage to the shutter that also functions as a target through the one corresponding target.

4. The film-forming apparatus according to claim 3, wherein the shutter that also functions as a target comprises a conductive protrusion on a surface facing the one corresponding target side, and is brought into conduction by coming into contact with the one corresponding target through the conductive protrusion.

5. The film-forming apparatus according to claim 4, wherein a length of the conductive protrusion is set to be a Debye length or less.

6. The film-forming apparatus according to claim 3, wherein the shutter that also functions as a target is brought into conduction by bringing a surface facing the one corresponding target side into direct contact with the one corresponding target.

7. The film-forming apparatus according to claim 1, further comprising a power supply that supplies a voltage to one of the multiple cathode mechanisms corresponding to the one corresponding target, the power supply directly applying a voltage to the shutter that also functions as a target through a wire.

8. The film-forming apparatus according to claim 2, wherein the shutter that also functions as a target is separated from the one corresponding target at the time of pre-sputtering before start of the sputtering.

9. The film-forming apparatus according to claim 8, wherein a distance between the shutter that also functions as a target and the one corresponding target is set to be a dimension exceeding a Debye length.

10. The film-forming apparatus according to claim 1, wherein the shutter that also functions as a target is formed of at least two materials, and the target material different from the materials for the plurality of the targets is placed on the film formation subject side.

11. The film-forming apparatus according to claim 1, wherein the shutter that also functions as a target is configured so as to perform a tilt and shift operation of changing a tilt of the shutter that also functions as a target.

12. A film-forming method of forming a multilayered thin film on a film formation subject by sputtering using an apparatus comprising:
   a vacuum chamber;
   a holder portion for holding the film formation subject in the vacuum chamber;
   multiple cathode mechanisms for respectively supporting targets made of materials different from each other so that the targets are opposed to the film formation subject in the vacuum chamber; and
   multiple shutters, which correspond to respective targets, movable forward and backward individually between the targets and the film formation subject, the at least one of the multiple shutters being formed of a target material different from the materials for the plurality of the targets,
   the method comprising the steps of:
   moving one of the multiple shutters backward from a position opposite to one of the targets supported by the multiple cathode mechanisms, thereby forming a film using one of the targets supported by the multiple cathode mechanisms as a target used for sputtering;
   arranging one of the multiple shutters at a position opposite to one of the targets supported by the multiple cathode mechanisms, thereby forming a film using one of the multiple shutters as a target used for sputtering, wherein the moving step and the arranging step are alternately changed; and
   conducting sputtering using, in turn, each of the targets supported by the multiple cathode mechanisms and the at least one of the multiple shutters as a target used for sputtering.

13. The film-forming method according to claim 12, wherein, at the time of sputtering using the shutter that also functions as a target, the shutter is moved to a side of one of the targets that is corresponding to the shutter so that at least a part of the shutter is brought into contact with the one of the targets to thereby apply a voltage to the shutter through the one of the targets.

14. A film-forming method of forming a multilayered thin film on a film formation subject by sputtering using an apparatus comprising:
- a vacuum chamber;
- a holder portion for holding the film formation subject in the vacuum chamber;
- a first cathode mechanism for respectively supporting a first target so that the first target is opposed to the film formation subject in the vacuum chamber;
- a second cathode mechanism for respectively supporting a second target formed of a target material different from the materials for the first target so that the second target is opposed to the film formation subject in the vacuum chamber;
- a first shutter movable forward and backward individually between the first target and the film formation subject, the first shutter being formed of a target material different from the materials for the first and second targets; and
- a second shutter movable forward and backward individually between the second target and the film formation subject, the method comprising the steps of:
- arranging the second shutter at a position opposite to the second target supported by the second cathode mechanism and applying a voltage to the first cathode mechanism in a state where the first shutter is moved backward from a position opposite to the first target supported by the first cathode mechanism, whereby a film is formed using the first target as a target used for sputtering;
- arranging the first shutter at a position opposite to the first target supported by the first cathode mechanism and applying a voltage to the second cathode mechanism in a state where the second shutter is moved backward from a position opposite to the second target supported by the second cathode mechanism, whereby a film is formed using the second target as a target used for sputtering; and
- arranging the first shutter at a position opposite to the first target supported by the first cathode mechanism and applying a voltage to the first shutter in a state where the second shutter is arranged at a position opposite to the second target supported by the second cathode mechanism, whereby a film is formed using the first shutter as a target used for sputtering,
- wherein the three arranging steps are performed in turn to conduct sputtering.

* * * * *